(12) United States Patent
Ito et al.

(10) Patent No.: US 11,906,588 B2
(45) Date of Patent: Feb. 20, 2024

(54) BATTERY MONITORING APPARATUS

(71) Applicant: DENSO CORPORATION, Kariya (JP)

(72) Inventors: Akihiko Ito, Kariya (JP); Tatsuhiro Numata, Kariya (JP)

(73) Assignee: DENSO CORPORATION, Kariya (JP)

( * ) Notice: Subject to any disclaimer, the term of this patent is extended or adjusted under 35 U.S.C. 154(b) by 0 days.

(21) Appl. No.: 17/720,768

(22) Filed: Apr. 14, 2022

(65) Prior Publication Data

US 2022/0236330 A1 Jul. 28, 2022

Related U.S. Application Data

(63) Continuation of application No. 16/674,074, filed on Nov. 5, 2019, now Pat. No. 11,333,709.

(30) Foreign Application Priority Data

Nov. 5, 2018 (JP) ................. 2018-208341

(51) Int. Cl.
*G01R 31/371* (2019.01)
*H04W 76/10* (2018.01)
*B60L 58/18* (2019.01)
*B60L 58/12* (2019.01)
*G01R 31/3835* (2019.01)

(52) U.S. Cl.
CPC ............ *G01R 31/371* (2019.01); *B60L 58/12* (2019.02); *B60L 58/18* (2019.02); *G01R 31/3835* (2019.01); *H04W 76/10* (2018.02)

(58) Field of Classification Search
CPC .......... G01R 31/371; G01R 31/3835; G01R 31/396; B60L 58/12; B60L 58/18; B60L 2240/547; B60L 2240/80; H04W 76/10; Y02T 90/16

USPC ....................................... 324/434
See application file for complete search history.

(56) References Cited

U.S. PATENT DOCUMENTS

| | | | |
|---|---|---|---|
| 5,722,058 | A | 2/1998 | Umemoto et al. |
| 6,707,375 | B2 | 3/2004 | Masudaya |
| 6,819,229 | B2 | 11/2004 | Ghabra et al. |
| 7,672,666 | B2 | 3/2010 | Hasan et al. |

(Continued)

FOREIGN PATENT DOCUMENTS

| | | |
|---|---|---|
| CN | 1522905 B | 4/2010 |
| JP | 2005-001452 A | 1/2005 |

(Continued)

*Primary Examiner* — M Baye Diao
(74) *Attorney, Agent, or Firm* — Oliff PLC

(57) ABSTRACT

A battery monitoring apparatus includes a battery ECU, satellite devices each of which measures the voltage at a battery cell in response to a command signal from the battery ECU, and a wireless module which achieves a wireless communication between the battery ECU and each of the satellite devices after a wireless connection between the battery ECU and each of the satellite devices is completed. When receiving a start signal outputted before a start switch for a drive power source of the vehicle is turned on, the wireless module is activated to start the wireless connection between the battery ECU and each of the satellite devices. This establishes and completes the wireless connections faster than when the wireless module is activated simultaneously with turning on of the start switch for the drive power source. This achieves quick monitoring of the state of the battery cells.

9 Claims, 5 Drawing Sheets

(56) References Cited

U.S. PATENT DOCUMENTS

| | | | |
|---|---|---|---|
| 8,692,663 B2* | 4/2014 | Fecher | B60L 58/24 |
| | | | 180/68.5 |
| 8,769,327 B2 | 7/2014 | Lu et al. | |
| 9,725,069 B2 | 8/2017 | Krishnan | |
| 10,043,329 B2 | 8/2018 | Murray et al. | |
| 10,401,937 B2 | 9/2019 | Darin et al. | |
| 10,894,484 B2 | 1/2021 | Han et al. | |
| 11,031,640 B2 | 6/2021 | Murase et al. | |
| 11,395,119 B2* | 7/2022 | Han | B60L 58/10 |
| 11,417,918 B2* | 8/2022 | Numata | H01M 10/482 |
| 2001/0028296 A1 | 10/2001 | Masudaya | |
| 2012/0286927 A1 | 11/2012 | Hagl | |
| 2016/0268642 A1 | 9/2016 | Yamazoe et al. | |
| 2017/0101076 A1 | 4/2017 | Krishnan | |
| 2018/0089918 A1 | 3/2018 | Murray et al. | |
| 2019/0139326 A1 | 5/2019 | Park et al. | |
| 2019/0306592 A1 | 10/2019 | Pusheck et al. | |
| 2020/0064408 A1 | 2/2020 | Sato | |
| 2020/0086357 A1 | 3/2020 | Liu et al. | |
| 2020/0142004 A1 | 5/2020 | Ito et al. | |

FOREIGN PATENT DOCUMENTS

| | | |
|---|---|---|
| JP | 2005-515330 A | 5/2005 |
| JP | 2008-509611 A | 3/2008 |
| JP | 2011-163295 A | 8/2011 |
| JP | 2018-058379 A | 4/2018 |
| WO | 2013/051157 A1 | 4/2013 |

* cited by examiner

BATTERY MONITORING APPARATUS

CROSS REFERENCE TO RELATED DOCUMENTS

The present application is a continuation of U.S. patent application Ser. No. 16/674,074, filed Nov. 5, 2019, which claims the benefit of priority of Japanese Patent Application No. 2018-208341 filed on Nov. 5, 2018, the entire disclosures of each of which are herein incorporated by reference.

BACKGROUND

1 Technical Field

This disclosure relates generally to a battery monitoring apparatus working to monitor the state of a battery cell mounted in a vehicle such as an automobile.

2 Background Art

Typical battery monitors are equipped with a battery ECU, a satellite device working to determine voltage at a battery cell in response to a command from the battery ECU, and a communication device establishing communications with the battery ECU and the satellite device. A battery monitor is known which is equipped with a wireless module working as a communication device. The battery monitor is thought of as being designed, like a wire communication device, to actuate the wireless module to start a wireless connection simultaneously with turning on of a start switch of a power unit for a vehicle, such as an engine or an electrical motor in order to eliminate dark current consumed by the communication device.

The wireless connection usually requires several seconds between the start and completion thereof. During all that time, it is impossible to measure the voltage at the battery cell to calculate a SOC (State Of Charge) of the battery cell. It is, therefore, impossible to start monitoring the state of the battery cell immediately after the start switch for the drive power source mounted in the vehicle is turned on, thus undesirably consuming time to start the vehicle.

SUMMARY

It is an object of this disclosure to provide a battery monitoring apparatus capable of quickly starting to monitor a state of a battery cell.

According to one aspect of this disclosure, there is provided a battery monitoring apparatus which monitors states of battery cells installed in a vehicle. The battery monitoring apparatus comprises: (a) a battery ECU; (b) satellite devices each of which measures a voltage at a battery cell in response to a command signal wirelessly outputted from the battery ECU; and (c) a wireless module which achieves a wireless communication between the battery ECU and each of the satellite devices after a wireless connection between the battery ECU and each of the satellite devices is completed. When receiving a start signal outputted before a start switch for a drive power source of the vehicle is turned on, the wireless module is activated to start the wireless connection between the battery ECU and each of the satellite devices.

The battery monitoring apparatus is capable of actuating the wireless module in response to the start signal to achieve the wireless connections before the start switch of the drive power source is turned on. This achieves the start and completion of the wireless communication earlier than when the wireless module is actuated simultaneously with turning on of the start switch of the drive power source, thereby quickly starting to monitor the state of the battery cells.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENTS

First Embodiment

Figure 1:
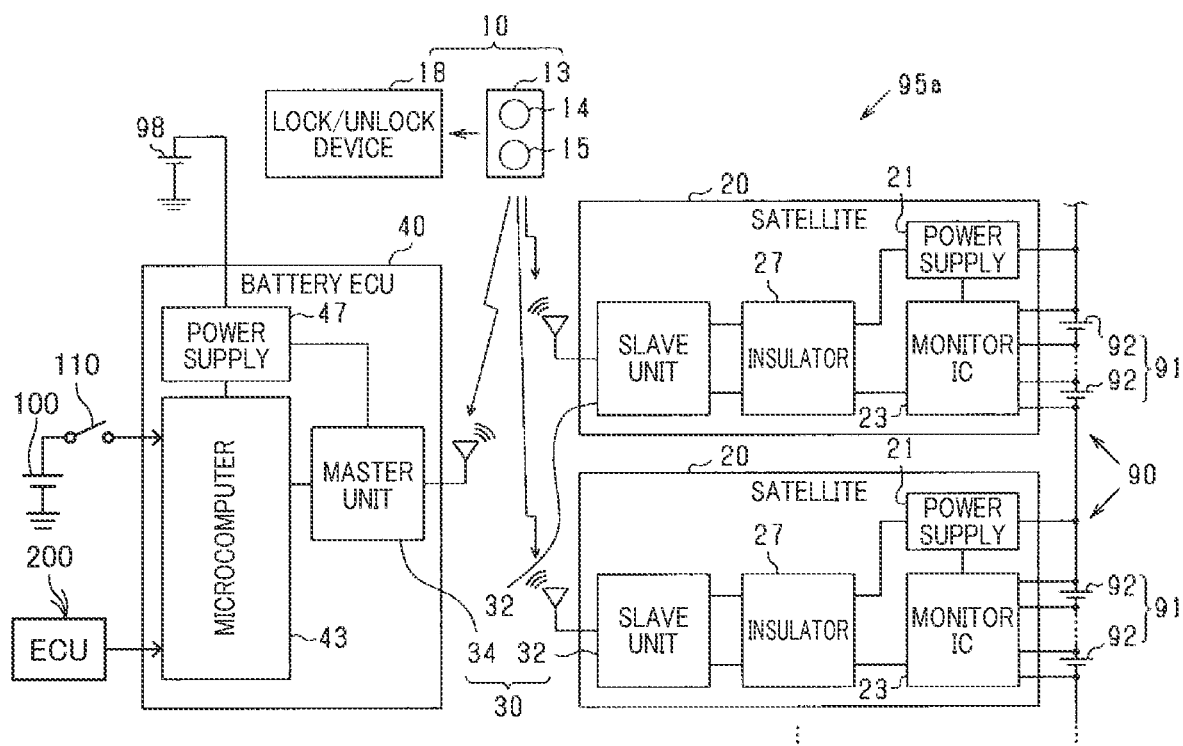
FIG. 1 is a schematic view which illustrates a battery monitoring apparatus according to the first embodiment.

FIG. 1 schematically illustrates the structure of the battery monitoring apparatus 95a according to the first embodiment. The battery monitoring apparatus 95a works to monitor the state of the assembled battery 90 made up of a plurality of battery modules 91 connected in series with each other. Each of the battery modules 91 includes a plurality of battery units 92 connected in series with each other. Each of the battery units 92 may be implemented by a single electrochemical cell or a plurality of electrochemical cells connected in series with each other. The assembled battery 90 and the battery monitoring apparatus 95a are mounted in a vehicle, such as an automobile, equipped with a drive power source, such as an internal combustion engine and/or an electrical motor.

The battery monitoring apparatus 95a includes the battery ECU (Electronic Control Unit) 40, the satellite devices (e.g., satellite ECUs) 20, one provided for each of the battery modules 91, and the wireless module 30 which performs wireless telecommunications between the battery ECU 40 and each of the satellite devices 20. The vehicle is equipped with the keyless entry system 10. The keyless entry system 10 includes the controller 13 and the lock/unlock deice 18. The controller 13 is equipped with the lock button 14 and the unlock button 15. When the lock button 14 is depressed, the controller 13 wirelessly outputs a lock signal. Alternatively, when the unlock button 15 is depressed, the controller 15 wirelessly outputs an unlock signal. The lock/unlock device 18 locks or unlocks doors of the vehicle in response to the lock signal or the unlock signal.

The wireless module 30 includes the slave units 32 installed in the satellite devices 20 and the master unit 34 installed in the battery ECU 40. The slave unit 32 may be arranged inside or outside the main body of the satellite device 20. The master unit 34 may be disposed inside or outside the main body of the battery ECU 40.

Each of the satellite devices 20 is equipped with the power supply 21 and the monitor IC 23. The power supply 21 is connected to the battery module 91 and the monitor IC 23 and also connected to the slave unit 32 through the insulating device 27. The power supply 21 delivers electrical power, as derived from the battery module 91, to the monitor IC 23 and the slave unit 32 to actuate the monitor IC 23 and the slave units 32.

The monitor IC 23 is, as clearly illustrated in FIG. 1, electrically connected to terminals of each of the battery units 92 and also connected to the slave unit 32 through the insulating device 27. The insulating device 27 creates electrical insulation between the slave unit 32 which is designed in the form of a low voltage circuit and each of the power supply 21 and the monitor IC 23 which are designed in the form of a high voltage circuit and also achieves transmission of electrical power or electrical signals therebetween.

The battery ECU 40 is equipped with the power supply 47 and the microcomputer 43. The power supply 47 is connected to the battery 98, the microcomputer 43, and the master unit 34 and delivers electrical power, as derived from the battery 98, to the microcomputer 43 and the master unit 34 to actuate the microcomputer 43 and the master unit 34. The battery 98 is separate from the battery modules 91.

The microcomputer 43 outputs commands to the master unit 34 for the satellite devices 20. The master unit 34 wirelessly outputs the commands to the slave units 32. When receiving the command, each of the slave units 32 outputs it to the monitor IC 23. The monitor IC 23 is responsive to the command to measure a terminal-to-terminal voltage at each of the battery units 92, electrical current in each of the battery units 92, and/or temperature of each of the battery units 92, or conduct self-diagnosis and outputs data on the terminal-to-terminal voltage, the current, the temperature, and a result of the self-diagnosis to the slave unit 32. The slave unit 32 then wirelessly outputs the received data to the master unit 34.

When receiving the data from the slave units 32, the master unit 34 transmits it to the microcomputer 43. The microcomputer 43 analyzes the data and calculates an internal resistance and a state of charge (SOC) in each of the battery units 92 to monitor the state of the assembled battery 90.

The unlock signal outputted by the controller 13 of the keyless entry system 10 also functions as a start signal to turn on or actuate the slave units 32 and the master unit 34. Specifically, when the drive power source installed in the vehicle is at rest, the slave units 32 and the master unit 34 are all in an off-state, but placed in a stand-by state where the unlock signal is receivable. When receiving the unlock signal, each of the slave units 32 and the master unit 34 is actuated to start telecommunications with the other.

Figure 2:
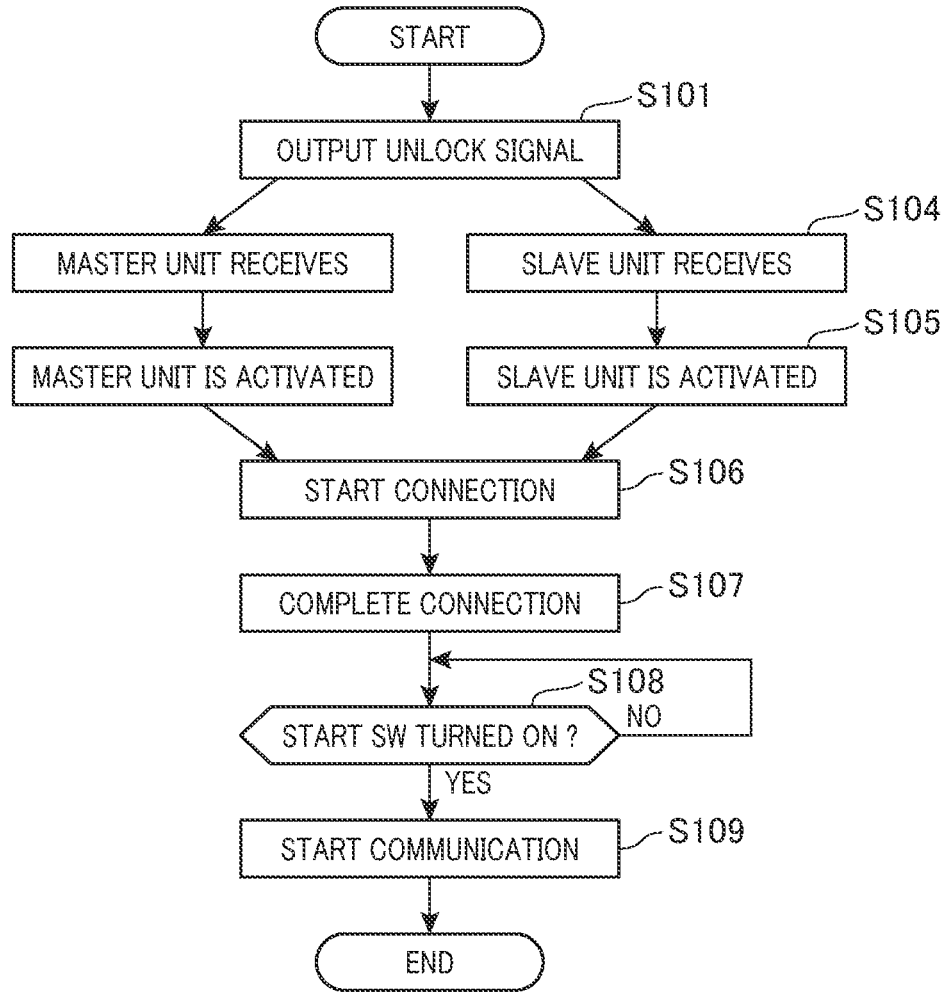
FIG. 2 is a flowchart which demonstrates how a wireless module achieves wireless connections.
Figure 3:
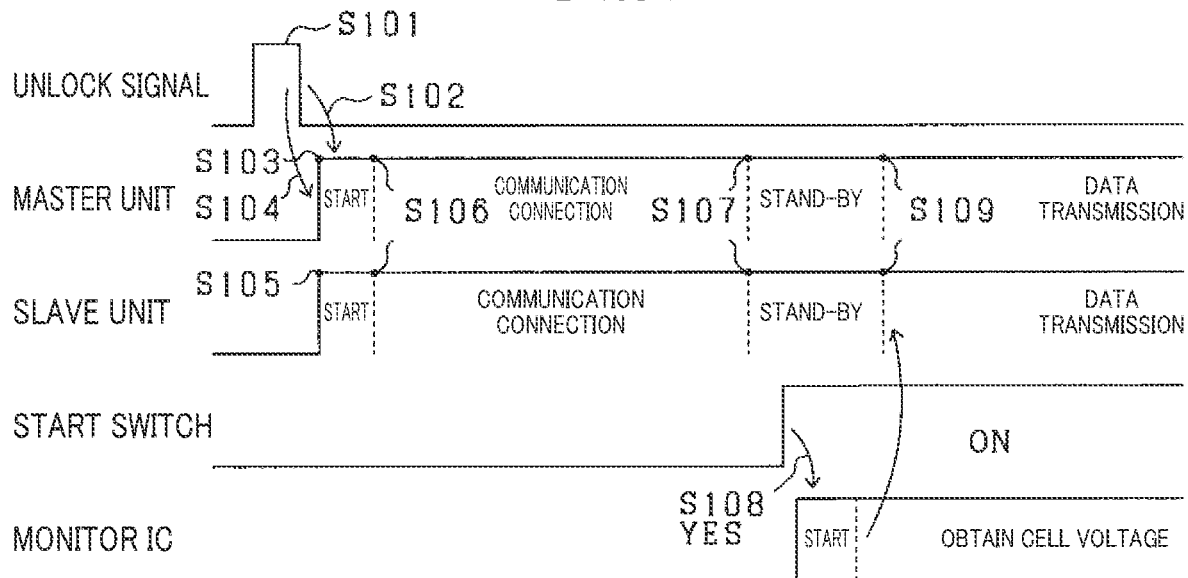
FIG. 3 is a timing chart which demonstrates a sequence of steps to achieve wireless connections.

FIG. 2 is a flowchart of a sequence of steps from output of the unlock signal to completion of wireless connection. FIG. 3 is a timing chart which demonstrates the sequence of steps in FIG. 2.

When a driver of the vehicle presses the unlock button 15 of the controller 13, the controller 13 outputs the unlock signal in step S101. When receiving the unlock signal outputted from the controller 13 in step S101, the master unit 34 starts to be actuated in step S103. When receiving the unlock signal in step S104, the slave units 32 starts to be activated in step S105. Afterwards, the master unit 34 and the slave units 32 start wireless communications in step S106 and complete the wireless communications in step S107. The completion of the wireless communications means a condition where it is possible to transmit a signal between the master unit 34 and the slave units 32. Subsequently, the master unit 34 and the slave units 32 are placed in the standby mode.

Afterwards, the microcomputer 43 determines whether the start switch 110, as illustrated in FIG. 1, for the drive power source has been turned on or not in step S108. This determination may be made by another device, i.e., the ECU 200 installed in the vehicle other than the battery ECU 40. The start switch 110 is connected to the battery 100. The switch 110 is turned on in response to turning on of an ignition switch of the vehicle. The microcomputer 43 determines that the start switch 110 is turned on when the ignition switch is turned on. Alternatively, the ECU 200 may determine that the start switch 110 has been turned on, that is, that the drive power source has been actuated in response to turning on of the ignition switch and output a signal indicative thereof to the microcomputer 43. If a NO answer is obtained in step S108, such a determination is repeated. Alternatively, if a YES answer is obtained in step S108 meaning that the start switch has been turned on, the determining device outputs a given signal to each of the monitor ICs 23 with or without wire to turn on the monitor IC 23. When activated, the monitor IC 23 measures the terminal-to-terminal voltage at the battery units 92, the electrical current in the battery units 92, and/or the temperature of the battery units 92 or performs the self-diagnosis, and then outputs data on them to the slave unit 32. The slave unit 32 wirelessly outputs the received data to the master unit 34, in other words, starts the wireless communication between itself and the mater unit 34 in step S109. This starts the communication between the monitor IC 23 and the microcomputer 43. Specifically, the microcomputer 43 outputs a command to the monitor ICs 23. The monitor ICs 23 output the voltage data, etc. to the microcomputer 43.

Figure 4:
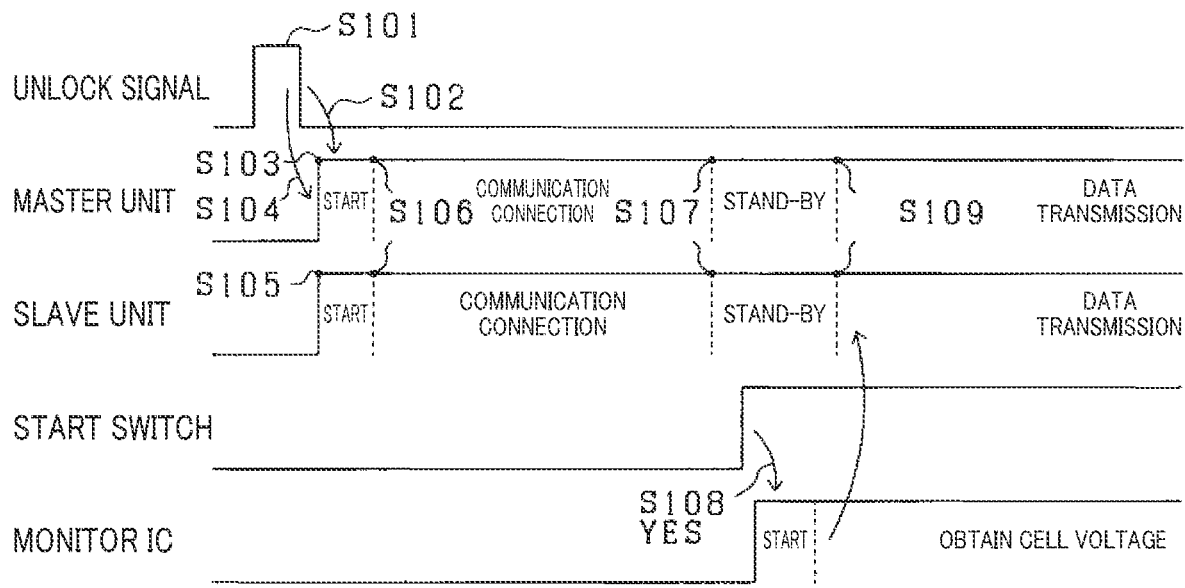
FIG. 4 is a timing chart which demonstrates a sequence of steps to achieve wireless connections in a modified form.

Step S108, as described above, determines whether the start switch of the drive power source is turned on, however, it may alternatively determine, as illustrated in FIG. 4, whether the driver has sat on the seat in the vehicle. If the driver is determined to have sat on the seat, the above wireless communications are started.

This embodiment offers the following beneficial advantages.

The wireless communication in the battery monitoring apparatus 95a enables space required for installation of wire harnesses to be reduced. The battery monitoring apparatus 95a is capable of actuating the wireless module 30 in response to the unlock signal from the keyless entry system 10 to achieve the wireless connections before the start switch of the drive power source is turned on. This achieves the start and completion of the wireless communication earlier than when the wireless module 30 is actuated simultaneously with turning on of the start switch of the drive power source, thereby quickly starting to monitor the state of the assembled battery 90 and enabling the vehicle to be started promptly.

The start signal to actuate the wireless module 30 is, as described above, provided by the unlock signal generated by the keyless entry system 10. This enables the wireless module 30 to be turned on in response to the unlock signal early before the driver gets in the vehicle to start the wireless communications. This results in an increase in time interval between the start of the wireless connections and the turning on of the start switch of the drive power source, thereby ensuring the stability in completing the wireless connections until the start switch of the drive power source is turned on. This quickly starts monitoring the conditions of the assembled battery 90 after the start switch of the drive power source is turned on.

Additionally, the master unit 34 and the slave units 32 are both turned on in response to the unlock signal, thereby quickly starting the wireless connections.

Embodiments other than the first embodiment will be described below. In the following discussion, the same reference numbers as in the first embodiment will refer to the same or similar parts, and explanation thereof in detail will be omitted here.

Second Embodiment

Figure 5:
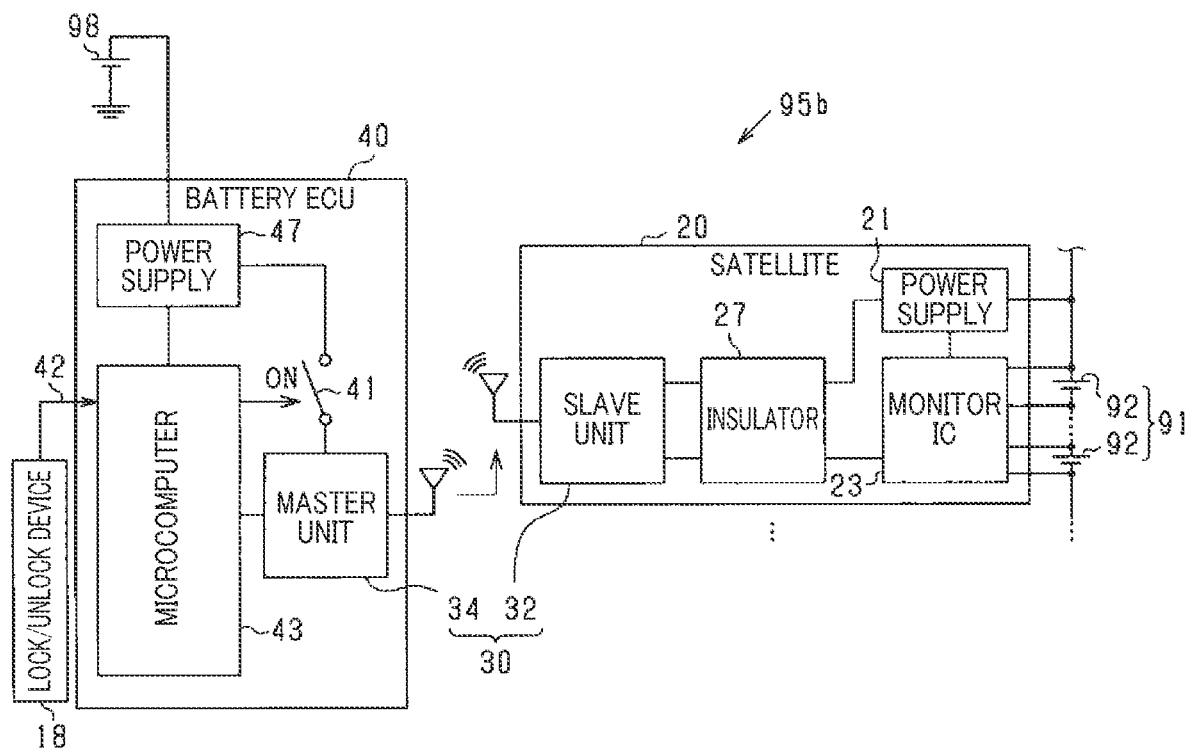
FIG. 5 is a schematic view which illustrates a battery monitoring apparatus according to the second embodiment.

The battery monitoring apparatus 95*b* of the second embodiment will be described below with reference to FIG. 5. FIG. 5 illustrates only one satellite device 20 for the sake of simplicity of disclosure. The same is true for the third or following embodiments described later.

The master unit 34 and the slave unit 32 are each designed not to receive the unlock signal. When the drive power source in the vehicle is in the off-state, the master unit 34 is at rest and not placed in the stand-by mode in which the a wireless signal is receivable. When the drive power source in the vehicle is in the off-state, the slave unit 32 is not yet actuated, but placed in the stand-by mode in which a wireless signal outputted from the master unit 34 is receivable.

The battery ECU 40 of the battery monitoring apparatus 95*b* is equipped with the switch 41 disposed in a conductor which achieves an electrical connection between the power supply 47 and the master unit 34. When receiving the unlock signal from the controller 13, the lock/unlock device 18 unlocks the doors of the vehicle and outputs a given signal to the microcomputer 43 through the CAN 42. When receiving such a signal, the microcomputer 43 turns on the switch 41 to actuate the master unit 34. The master unit 34 then wirelessly outputs a signal to the slave unit 32 to actuate the slave unit 32.

The second embodiment offers the following beneficial advantages.

The microcomputer 43 is designed to turn on the switch 41 to start the master unit 34. This enables the master unit 34 to be turned on without need for placing the master unit 34 in the stand-by mode in which the unlock signal is receivable. This eliminates the need for consumption of dark current.

The turning on of the salve unit 32 is achieved by wirelessly outputting a signal from the master unit 34 to the slave unit 32. The slave unit 32 only needs to be designed to receive a wireless signal from the master unit 34, in other words, does not need to have a structure capable of receiving the unlock signal. This results in simple functions and structure of the slave unit 32.

Third Embodiment

Figure 6:
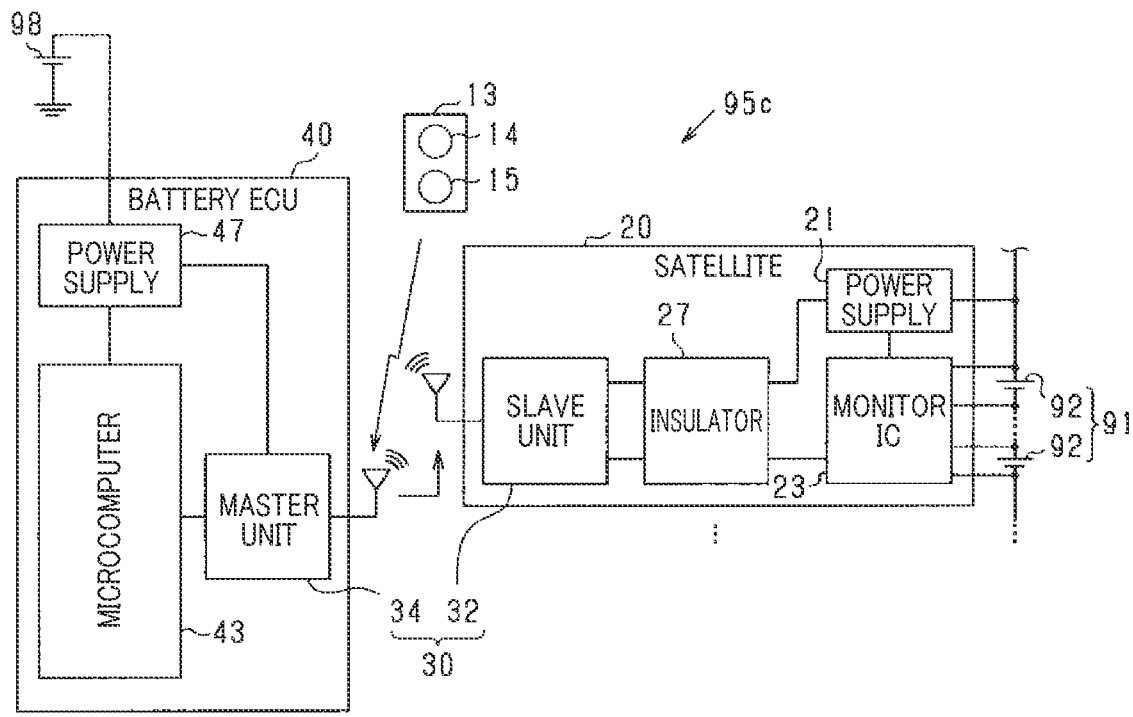
FIG. 6 is a schematic view which illustrates a battery monitoring apparatus according to the third embodiment.

The battery monitoring apparatus 95*c* in the third embodiment will be described below with reference to FIG. 6. The slave unit 32 is, like in the second embodiment designed not to have a structure to receive the unlock signal. The master unit 34 is first actuated in response to the unlock signal and then wirelessly outputs a signal to the slave unit 32 to turn on the slave unit 32.

The above structure of the battery monitoring apparatus 95*c* in which the master unit 34 receives the unlock signal, like the second embodiment, results in simplified functions and structure of the slave unit 32.

Fourth Embodiment

The battery monitoring apparatus 95*d* in the fourth embodiment will be described below with reference to FIG. 7. The master unit 34 is designed not to receive the unlock signal. The slave unit 32 is actuated first in response to the unlock signal and then wirelessly outputs a signal to the master unit 34 to turn on the master unit 34.

The above structure of the battery monitoring apparatus 95*d* in which the master unit 34 is actuated in response to a wireless signal outputted from the slave unit 32 enables the master unit 34 to be designed only to receive the wireless signal from the slave unit 32, thereby eliminating the need for the master unit 34 to be engineered to receive the unlock signal. This results in simplified functions and structure of the master unit 34.

Fifth Embodiment

The battery monitoring apparatus 95*e* in the fifth embodiment will be described below with reference to FIG. 8. The battery monitoring apparatus 95*e* includes a plurality of master units 34. Each of the master units 34 is associated with one or more of the slave units 32. In other words, each of the master units 34 wirelessly outputs a signal to corresponding one or more of the slave units 32. The slave unit 32 is turned on in response to the wireless signal outputted from a corresponding one of the master units 34 to start a wireless connection therebetween.

As apparent from the above discussion, each of the master units 34 is designed only to wirelessly output a signal to corresponding one or more of the slave units 32, thereby eliminating a load on the master units 34 to directly turn on the slave units. Each of the master units 34 achieves a wireless connection with the corresponding one or more of the slave units 32, thereby resulting in a decrease in load on the master units 34 required to establish connections with the slave units 32 as compared with the conventional structure.

Modifications

Each of the above embodiments may be modified in the following ways. For instance, a wireless or a wired signal may be used to turn on the wireless module 30 instead of the unlock signal.

Specifically, for example, when the door of the vehicle is opened, a wired or wireless start signal may be outputted to the master unit 34, the slave units 32, the microcomputer 43, or the monitor ICs 23 to turn on the wireless module 30. Alternatively, a human detecting sensor may be used. When a human body is detected by the human detecting sensor, a wired or wireless start signal may be outputted to the master unit 34, the slave units 32, the microcomputer 43, or the monitor ICs 23 to turn on the wireless module 30. Alternatively, when the driver sits on the seat in the vehicle, a wired or wireless start signal may be outputted to the master unit 34, the slave units 32, the microcomputer 43, or the monitor ICs 23 to turn on the wireless module 30.

The battery monitoring apparatus 95b in the second embodiment of FIG. 5 which has the switch 41 to establish or block an electrical connection between the power supply 47 and the master unit 34 in the battery ECU 40 may alternatively be designed to have a switch disposed on an conductor connecting between the power supply 21 and the slave unit 32 in the satellite device 20. When receiving the unlock signal, the lock/unlock device 18 outputs a signal to the monitor IC 23 through a CAN. The monitor IC 23 then turns on the switch to connect between the power supply 21 and the slave unit 32 to activate the slave unit 32. The slave unit 32 then wirelessly outputs a signal to the master unit 34 to activate the master unit 34.

Figure 7:
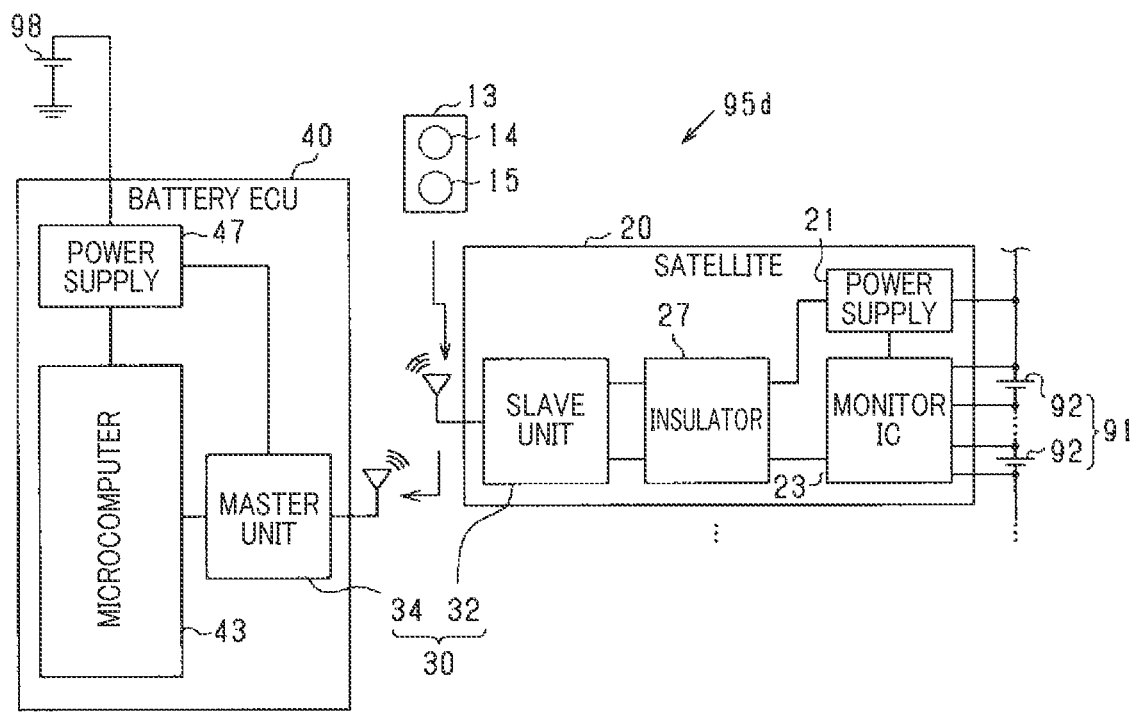
FIG. 7 is a schematic view which illustrates a battery monitoring apparatus according to the fourth embodiment.

The battery monitoring apparatus 95d illustrated in FIG. 7 may alternatively be designed to have the slave units 32 only one of which receives the unlock signal and then wirelessly outputs a signal to the master unit 34 to turn on the master unit 34. The master unit 34 then wirelessly outputs signals to turn on the slave units 32 other than the one which has received the unlock signal.

Figure 8:
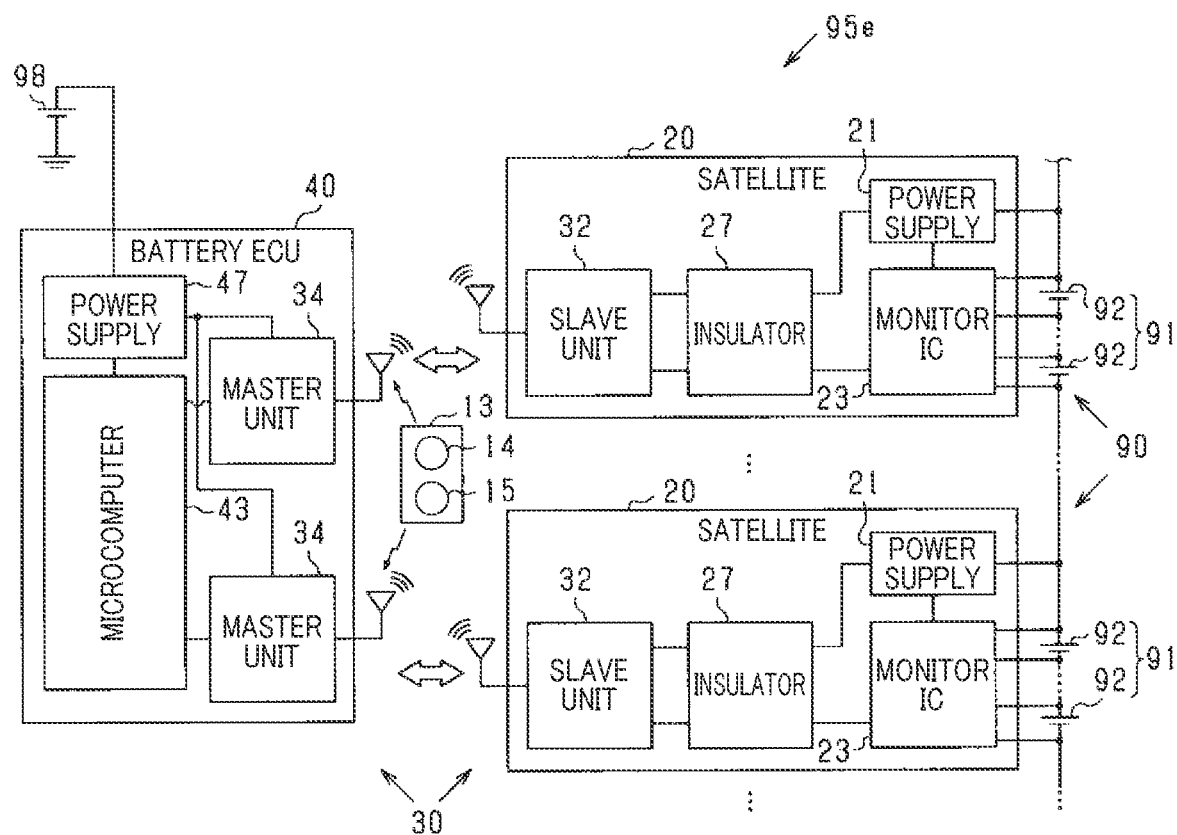
FIG. 8 is a schematic view which illustrates a battery monitoring apparatus according to the fifth embodiment.

The battery monitoring apparatus 95e in the fifth embodiment of FIG. 8 may alternatively be designed not to determine which of the slave units 32 each of the master units 34 should be associated with in an initial stage, but determine only the number of the slave units 32 that each of the master units 34 should communicate with in the initial stage. After outputting a wireless signal, each of the master units 34 selects those slave units 32 which have received the wireless signal as target(s) which it should have a wireless connection with. Alternatively, when receiving a wireless signal from one of the slave units 32, the master unit 34 selects the slave unit 32 which outputted the wireless signal as a target which it should have a wireless connection with.

While the present invention has been disclosed in terms of the preferred embodiments in order to facilitate better understanding thereof, it should be appreciated that the invention can be embodied in various ways without departing from the principle of the invention. Therefore, the invention should be understood to include all possible embodiments and modifications to the shown embodiments which can be embodied without departing from the principle of the invention as set forth in the appended claims.

What is claimed is:

1. A battery monitoring apparatus which monitors states of battery cells installed in a vehicle comprising:
   a battery electronic control unit;
   satellite devices each of which measures a voltage at a battery cell in response to a command outputted from the battery electronic control unit; and
   a single wireless module configured to implement wireless communication between the battery electronic control unit and each of the satellite devices after a wireless connection between the battery electronic control unit and each of the satellite devices is completed, wherein the wireless module includes a plurality of master units installed in the battery electronic control unit and a plurality of slave units installed in the satellite devices, the battery electronic control unit includes a microcomputer configured to output the commands for the satellite devices to the master units, and
   the master units are connected parallel to each other directly with the microcomputer, each of the master units implementing the wireless communication with a corresponding one(s) of the slave units.

2. The battery monitoring apparatus as set forth in claim 1, wherein the master units transmit wireless signals to the slave units, and wherein each of the slave units is activated in response to reception of a corresponding one of the wireless signals to start the wireless communication.

3. The battery monitoring apparatus as set forth in claim 1, wherein each of the master units implements the wireless communication with at least one preselected slave unit.

4. The battery monitoring apparatus as set forth in claim 1, wherein the master units include a first master unit and a second master unit, and wherein at least one first slave unit is associated with the first master unit, and at least one second slave unit is associated with the second master unit which is different from the at least one first slave unit.

5. The battery monitoring apparatus as set forth in claim 1, wherein the battery electronic control unit includes a power supply which delivers electric power to the microcomputer and the master units, and wherein the master units are connected parallel to each other with the power supply.

6. The battery monitoring apparatus as set forth in claim 1, wherein each of the satellite devices includes a monitor which is connected to the battery cell to obtain a battery cell information, and a power supply which delivers electric power to the slave unit and the monitor, and wherein the power supply and the slave unit are connected together through an insulator.

7. The battery monitoring apparatus as set forth in claim 1, wherein each of the satellite devices includes a monitor which is connected to the battery cell to obtain a battery cell information, and a power supply which delivers electric power to the slave unit and the monitor, and wherein the monitor and the slave unit are connected together through an insulator.

8. The battery monitoring apparatus as set forth in claim 1, wherein each of the satellite devices includes a monitor which is connected to the battery cell to obtain a battery cell information, and a power supply which delivers electric power to the slave unit and the monitor, wherein the power supply and the slave unit are connected together through an insulator, and wherein the monitor and the slave unit are connected together through the insulator.

9. The battery monitoring apparatus as set forth in claim 1, wherein the master units are configured to implement the wireless communication simultaneously with the slave units.

* * * * *